US00RE44256E

(19) United States
(12) Reissued Patent
Bright et al.

(10) Patent Number: US RE44,256 E
(45) Date of Reissued Patent: Jun. 4, 2013

(54) ELECTRICAL INSTRUMENT PLATFORM FOR MOUNTING ON AND REMOVAL FROM AN ENERGIZED HIGH VOLTAGE POWER CONDUCTOR

(75) Inventors: James Bright, Hemet, CA (US); Larry Fish, White Plains, NY (US); John Engelhardt, Greenwich, CT (US); Paul Alex, Fairfield, CT (US); Duncan Breese, New Milford, CT (US)

(73) Assignee: Underground Systems, Inc., Armonk, NY (US)

(21) Appl. No.: 13/490,880

(22) Filed: Jun. 7, 2012
(Under 37 CFR 1.47)

Related U.S. Patent Documents

Reissue of:
(64) Patent No.: 7,733,094
Issued: Jun. 8, 2010
Appl. No.: 11/666,002
PCT Filed: Oct. 31, 2005
PCT No.: PCT/US2005/039064
§ 371 (c)(1),
(2), (4) Date: Feb. 7, 2008
PCT Pub. No.: WO2006/050156
PCT Pub. Date: May 11, 2006

U.S. Applications:
(60) Provisional application No. 60/623,900, filed on Nov. 1, 2004.

(51) Int. Cl.
*G01R 31/08* (2006.01)
*G01R 15/18* (2006.01)
*G01R 31/00* (2006.01)

(52) U.S. Cl.
USPC ..... 324/512; 324/127; 702/58; 702/59

(58) Field of Classification Search
USPC ..... 324/512, 127; 702/58, 59
See application file for complete search history.

(56) References Cited

U.S. PATENT DOCUMENTS

| | | | | |
|---|---|---|---|---|
| 4,799,005 | A | 1/1989 | Fernandes | |
| 4,801,937 | A | 1/1989 | Fernandes | |
| 5,029,101 | A * | 7/1991 | Fernandes | 702/62 |
| 6,097,429 | A * | 8/2000 | Seeley et al. | 348/154 |
| 7,337,080 | B2 * | 2/2008 | Doig et al. | 702/60 |

* cited by examiner

*Primary Examiner* — Amy He
(74) *Attorney, Agent, or Firm* — Frommer Lawrence & Haug LLP; William S. Frommer

(57) ABSTRACT

An apparatus for monitoring and measuring the electrical, thermal and mechanical operating parameters of high voltage power conductors. A toroidal shaped housing, which can be mounted onto an energized conductor, contains all of the necessary electrical instruments to monitor the parameters associated with the conductor. Moreover, the housing includes the processing capability to analyze disturbance and fault events based on these parameters.

12 Claims, 10 Drawing Sheets

ELECTRICAL INSTRUMENT PLATFORM FOR MOUNTING ON AND REMOVAL FROM AN ENERGIZED HIGH VOLTAGE POWER CONDUCTOR

Matter enclosed in heavy brackets [ ] appears in the original patent but forms no part of this reissue specification; matter printed in italics indicates the additions made by reissue.

CROSS-REFERENCE TO RELATED APPLICATIONS

This application claims the benefit of U.S. Provisional Application 60/623,900, filed Nov. 1, 2004.

FIELD OF THE INVENTION

The present invention relates generally to an apparatus for monitoring and measuring the electrical, thermal and mechanical operating parameters of high voltage power conductors. More particularly, the apparatus may be mounted onto overhead power transmission lines to monitor the operation of electrical power systems.

BACKGROUND OF THE INVENTION

Numerous instruments for measuring the operating parameters of power line conductors have been disclosed in the prior art. For example, U.S. Pat. Nos. 3,428,896; 3,633,191; 4,158,810; 4,268,818; 4,384,289 and 4,794,327 (the disclosures of which are incorporated herein by reference) each describe instruments for measuring and analyzing the performance of particular parameters of overhead power line conductors. Note, the terms power line, transmission line, and conductor are used interchangeably herein. Typically, these instruments only measure a subset of the many parameters needed to completely analyze an electrical power system. For example, prior art instruments may individually measure, but do not monitor: current flow in the conductor, conductor temperature, ambient temperature, conductor tension relative to a supporting tower, and/or conductor sag. To date, none of the prior art instruments measures or monitors a complete set of the parameters needed to fully describe the operational state of a power conductor. Moreover, prior art instruments do not provide for the sharing of data between similar instruments or multiple ground receiving stations. Rather, the above prior art references propose that individual instruments gather data for transmission through dedicated local ground receiving stations to central control stations for correlation and analysis. These instruments are simply not capable of simultaneously monitoring and analyzing many of the operating parameters of a transmission line.

In a system having several measuring instruments each transmitting data to ground based receivers, a means should be provided to ensure that more than one instrument is not transmitting at any given time. To avoid interference and data loss caused by more than one instrument transmitting data at a given time, it has been suggested that data could be transmitted in finite bursts at random times. However, under this approach, the possibility still exists that multiple instruments will transmit data at the same time.

Therefore, a need exists for an electrical instrument platform which may be mounted directly on an energized power conductor and is capable of simultaneously measuring and monitoring a complete set of parameters of the conductor while communicating those parameters to other similar instruments and also to local or remote ground based processors.

SUMMARY OF THE INVENTION

Accordingly, the present invention meets this need by providing an apparatus for mounting directly on an energized power conductor and which is capable of simultaneously measuring and monitoring a full suite of electrical, thermal and mechanical parameters of the conductor while communicating those values to other similar instruments and also to local or remote ground based processors. The present invention may process and analyze data generated by its own instruments, as well as data received from other such apparatus.

The present invention has the capability to monitor all necessary parameters, including disturbance events and fault events that may occur during the operation of a complete electrical power transmission system. The present invention provides complete monitoring by using power line mounted instruments, each capable of simultaneously sensing voltage, current, phase angle and other parameters of an associated conductor and communicating the measured parameters amongst these instruments, as well as to ground based processors.

As another aspect of the present invention, the apparatus incorporates all of the required instrument components in its housing. The apparatus may be installed on the conductor without shutting down the power transmission circuit. The apparatus may monitor the parameters being measured by comparing them against preset levels, and by storing data for later retrieval and analysis. The measured data may be communicated in real time, using wireless radio transceivers. Data communicated from the instruments to the receiving processors, whether local or remote, is already in condition for processing. This eliminates the need for accessories (such as auxiliary transformers, transducers, and the like) otherwise needed for signal conditioning and processing in prior art substation monitoring systems. The present invention interrogates each instrument in turn so that no two instruments in the apparatus are transmitting at the same time. This approach mitigates the possibility of data loss associated with prior art methods. The apparatus may be powered by the electro-magnetic field generated by current flowing through the power conductor to which it is mounted. A stored energy means (e.g. batteries) may be provided to power the apparatus when there is insufficient or no current flowing through the conductor.

Advantages of the present invention include the ability to monitor the operation of a conductor over time, rather than simply making single shot measurements; the ability to analyze measured data on-board and in real time; and the ability to draw its power by induction from the conductor. Further, the present invention provides for flexibility in the measurements which can be taken. Accordingly, the present invention is a significant improvement over prior art devices in the areas of processing, monitoring, flexibility, communications, and installation.

Still other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings.

I. Physical Description

The present invention provides an apparatus for monitoring and measuring the electrical, thermal and mechanical operating parameters of high voltage power conductors. More particularly, the apparatus is for use in systems that are mounted onto overhead power transmission lines and that measure parameters necessary to monitor the operation of single-phase circuits, three phase circuits, and entire electrical power systems.

Figure 1:
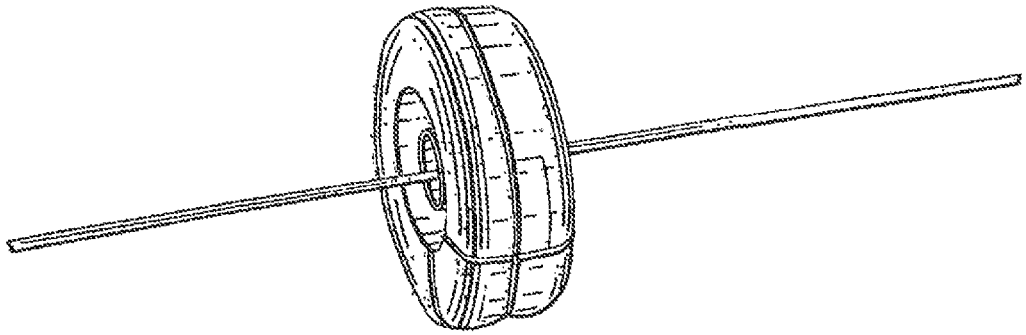
FIG. 1 illustrates apparatus of the present invention mounted on a transmission line.

The invention has a torus shaped housing with a metallic outer surface. FIG. 1 illustrates one embodiment of the present invention mounted on a transmission line. The housing incorporates all the components/instruments required to measure these parameters. The invention not only includes the means to monitor various parameters, but also includes the means to locally record the parameters for later retrieval, compare them against preset levels, and analyze disturbance and fault events based on these parameters. As described more fully below, the housing includes an embedded information processing capability to perform a complete analysis of the transmission line.

Figure 2:
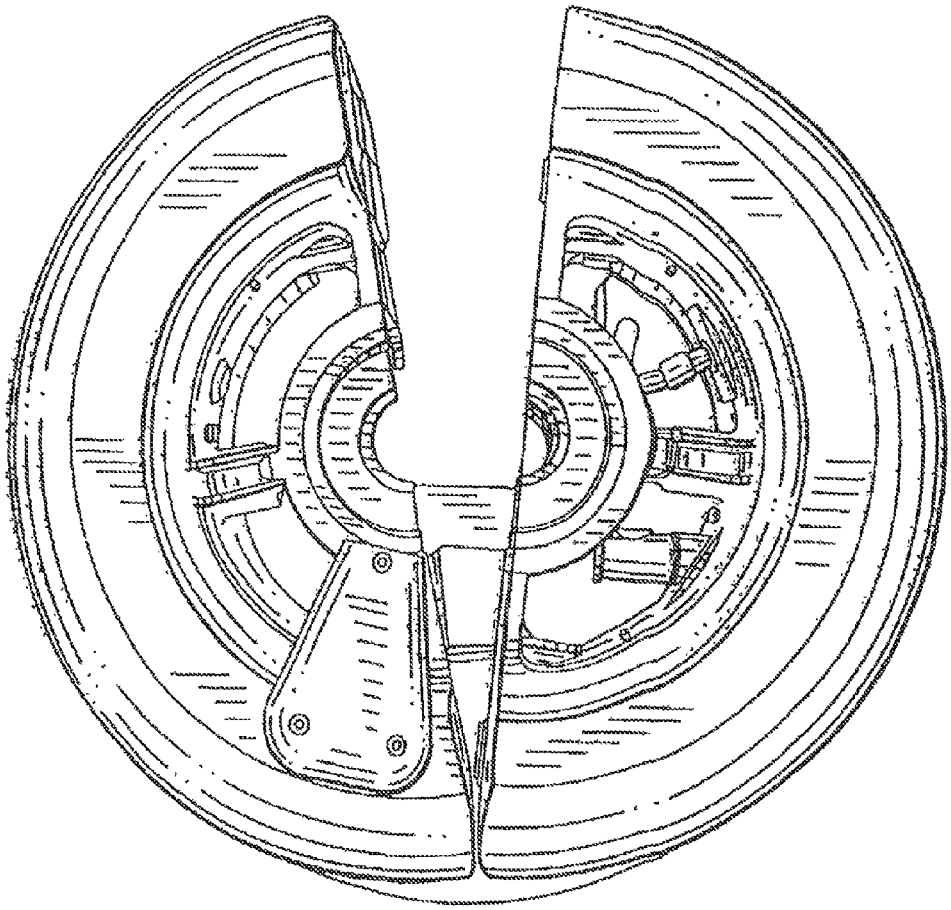
FIG. 2 is a top-view of the apparatus shown in an open position ready for mounting on a transmission line.

The toroidal housing has two half-sections that are hinged such that the housing can be split open to mount the apparatus onto a conductor, and then closed over the conductor when in the installed position. FIG. 2 is a top-view of an embodiment of the present invention shown in an open position ready for mounting on a transmission line. The axial center of the housing includes a central supporting member, or "hub," which thermally isolates the conductor from the housing. This hub fixes the housing to the conductor so that the housing will not rotate around or move along the conductor.

Figure 6:
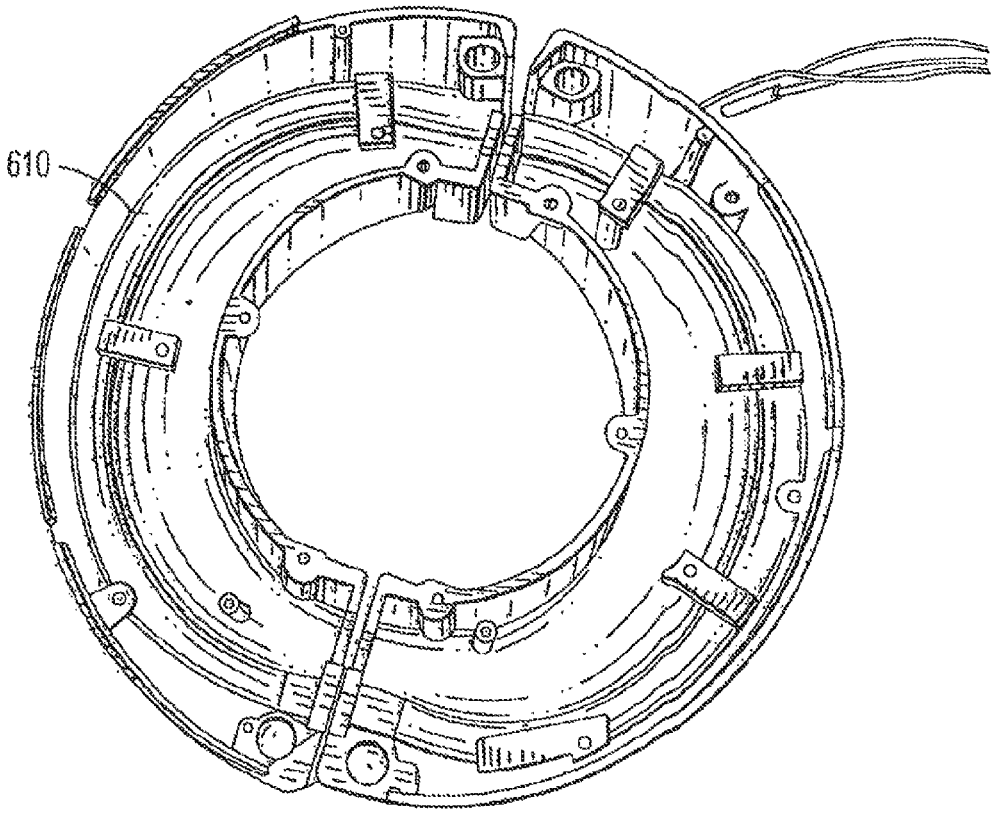
FIG. 6 is a top-view showing the Rogowski coil for measuring current mounted in the upper-half shell of the housing of the apparatus.
Figure 7:
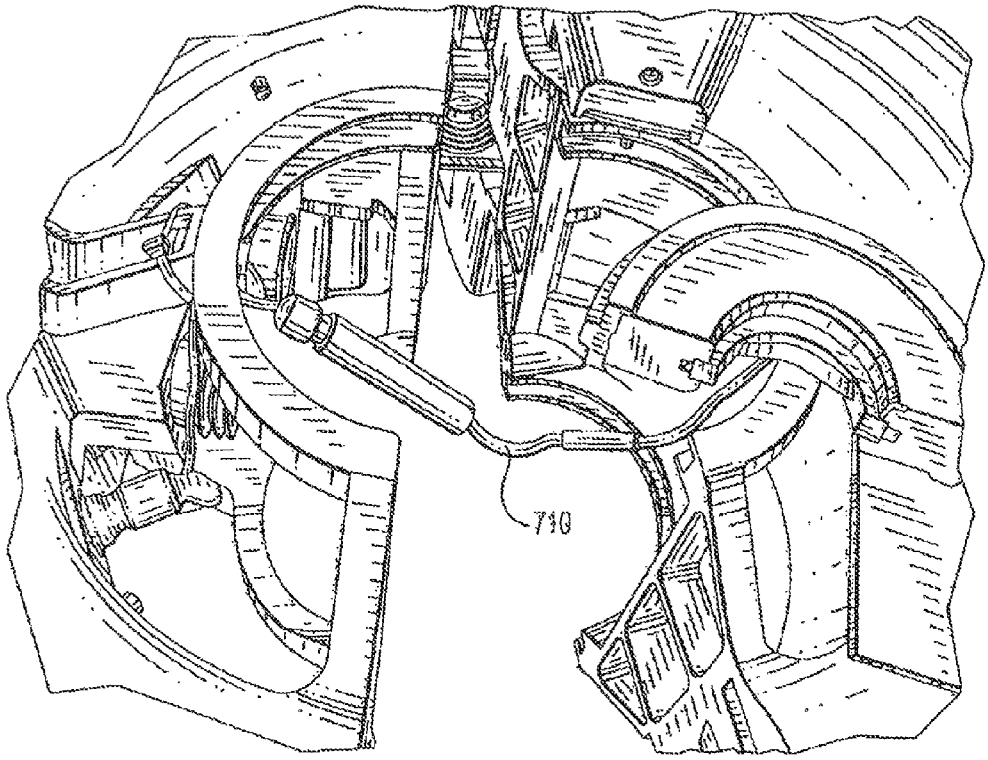
FIG. 7 illustrates the pick-up lead for measuring voltage mounted in the housing of the apparatus.

The housing typically includes electrical instruments for measuring the electric current flowing through the conductor, measuring the electric potential (voltage) of the conductor relative to ground, determining the phase relationship between the measured current and voltage, measuring the temperature of the conductor, sensing the pitch angle of the conductor, and/or sensing motion perpendicular to the longitudinal axis of the conductor. For example, FIG. 6 shows a top-view of a "Rogowski" coil 610 for measuring current mounted in the upper-half shell of the housing. FIG. 7 illustrates a pick-up lead 710 for measuring voltage mounted in the housing. The phase relationship between the current and voltage can readily be determined by comparing the phase between similar points (such as the peaks) on each waveform. The present apparatus may use an inclinometer to sense the pitch angle and an accelerometer to sense motion along and/or perpendicular to the axis of the conductor.

Figure 8:
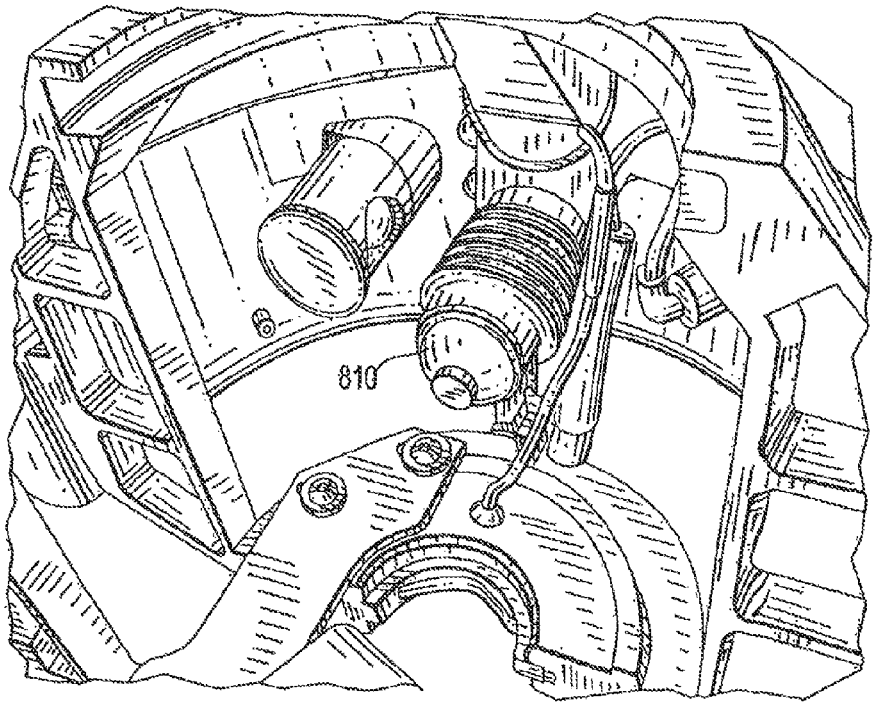
FIG. 8 illustrates one of two temperature probes for measuring temperature mounted in the housing of the apparatus.

One or more temperature probe(s) are mounted in the hub area of the housing to measure the temperature of the conductor and/or the ambient temperature. FIG. 8 shows a temperature probe 810 for measuring the temperature of the conductor. The temperature probes are thermally insulated so that the housing does not impact the measurements.

Further description of the instruments and measurements performed by the apparatus may be found in the commonly owned International Application No. PCT/US2005/025670, entitled "Dynamic Line Rating System with Real-Time Tracking of Conductor Creep to Establish the Maximum Allowable Conductor Loading as Limited by Clearance," filed Jul. 20, 2005; which is incorporated herein by reference.

More specifically, the apparatus may provide the following data:

a) voltage;
b) current;
c) phase angle between the voltage and current;
d) the power flow demand resulting from the voltage and current;
e) the power flow reactive demand resulting from the voltage and current;
f) the energy rate due to current flowing through the conductor resulting from the voltage and current;
g) the reactive energy rate due to current flowing through the conductor resulting from the voltage and current;
h) the temperature of the conductor in one or more locations around the circumference of the conductor;
i) the vibration of the conductor in a direction perpendicular to the conductor; i.e. power line galloping and Aeolian vibration;
j) the pitch angle of the conductor relative to horizontal; and
k) other parameters that characterize the real time operational state of a power conductor and can communicate real time reports to remote, ground based systems.

Figure 5:
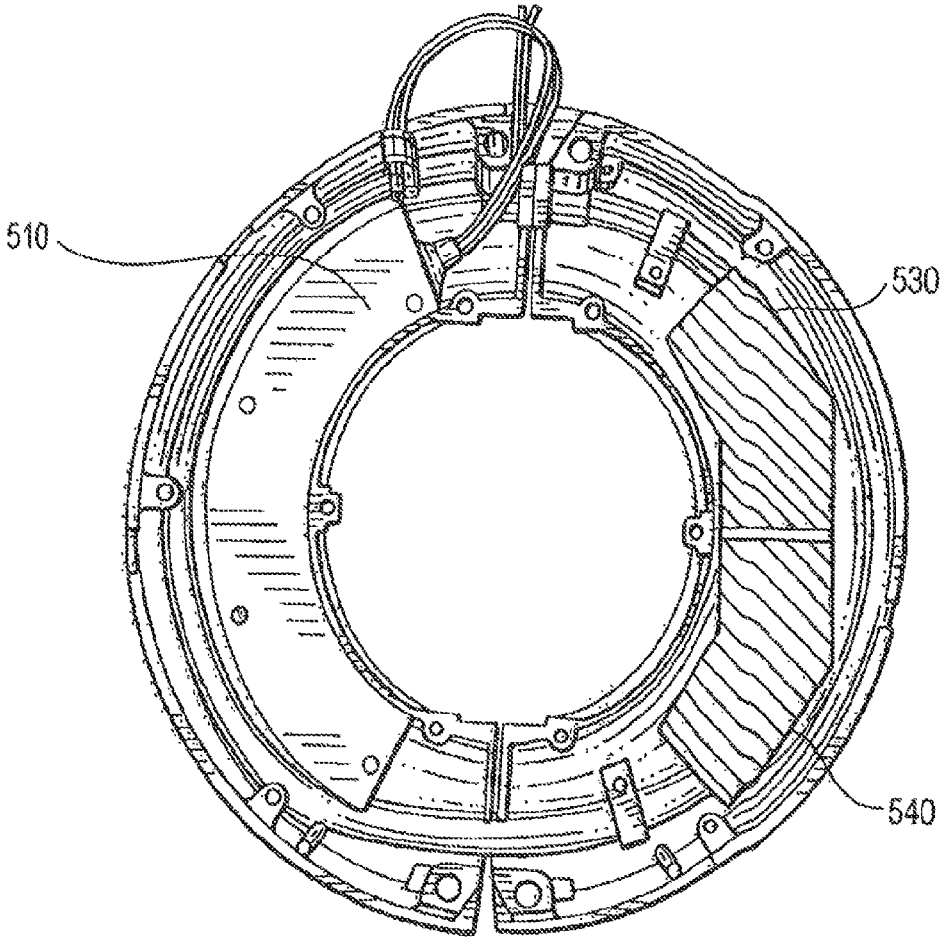
FIG. 5 is a top-view showing the battery pack mounted in the upper-half shell of the housing of the apparatus.

Processors in the apparatus can analyze the voltage and current waveforms to derive further information such as: disturbance events, fault events, and detection and mitigation of corona effects on the voltage and current measurements. Most of the calculations, processing, and analysis disclosed herein may be performed by software running on one or more processors located in the housing of the apparatus. These processors may be part of a processing unit 530 which might be fit into the housing as shown in FIG. 5. Analysis software for performing these calculations may be resident in the processors and/or stored in a memory. An exemplary memory or storage unit 540 may be fit into the housing as shown in FIG. 5. As mentioned above, such a storage unit may be used to record the data being collected by the instruments in the apparatus.

Data Transfer and Communication

Figure 9:
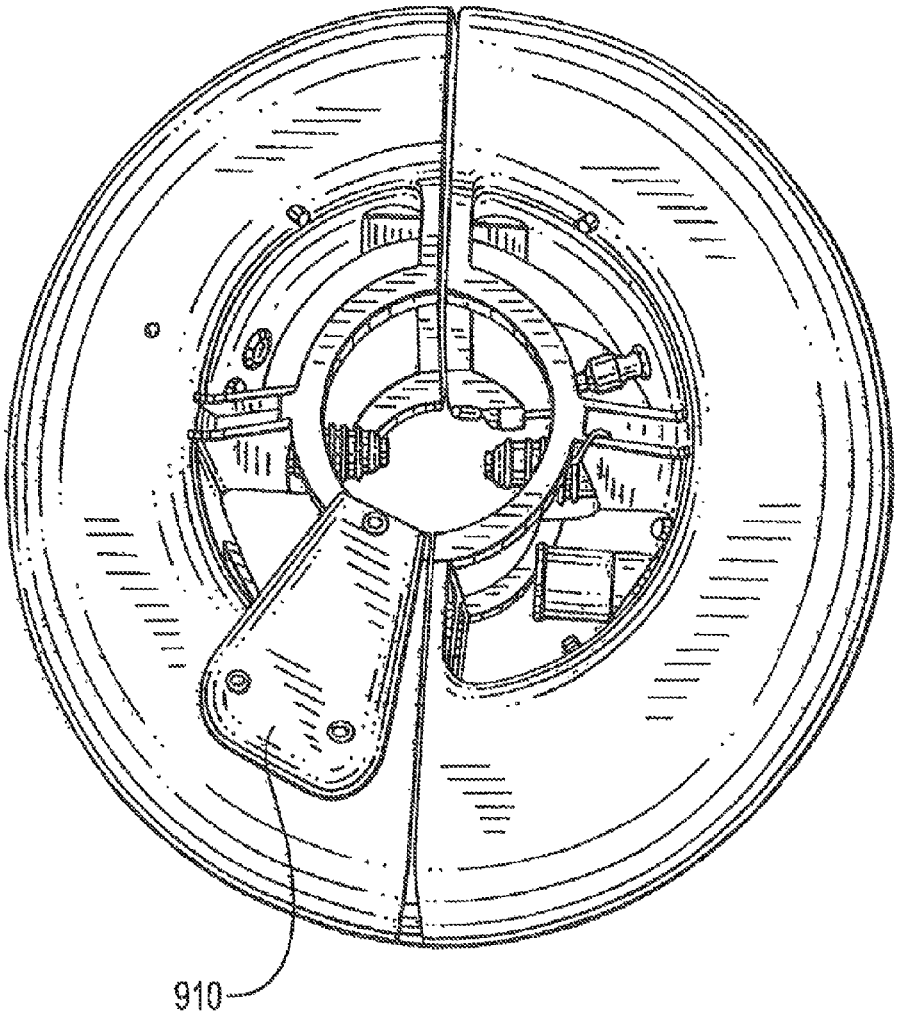
FIG. 9 is a top-view showing the radio antenna used for both wireless and cellular communications mounted on the housing of the apparatus.

The apparatus includes a communication unit for transmitting and receiving various measured and analyzed parameters to other similar apparatus at different locations on the conductor. Communications may be conducted in real-time, e.g.

using wireless radio transceivers, and/or may be on-demand using, for example, cellular telephone technology. FIG. 9 is a top-view of a communications transceiver 910 used for both wireless and cellular communications mounted on the housing of the apparatus in accordance with the present invention.

As discussed previously, prior art power line instruments require local, ground based devices to coordinate the collection of data, and to forward this data to remote processing units. Such ground based devices may be mounted on towers, or placed on pads at ground level. The present invention, because it is fitted with a communications transceiver, can be used without local ground based equipment.

Additionally, as part of its analysis capability, the present invention can receive global positioning signals (GPS). Typically, the time stamp from the GPS signal is extracted and used to ensure accurate calculations. A GPS unit may be included with the communications transceiver 910 shown in FIG. 9.

Another aspect of the present invention is data transfer using a time-multiplexed methodology. The present invention uses a modified time division multiple access (TDMA) data transfer protocol to transfer data between devices in the system. Data output from the devices, including to and from ground based processors, is cast in terms of a defined data communications protocol. The various data values produced by a device, as well as communication management parameters associated with the device (such as its address) are included in the data communications protocol. One device is selected to be the data transfer controller, i.e. the master device. All other devices are slaved to the master device for any data transfers. Typically, a ground based processor would be designated as the controller.

The data communications protocol defines a message frame, a message address and a message body. Each device in the system is assigned a unique system address. The message body may contain a command or a data response to the command. The controller sends an interrogation poll command simultaneously to all other devices and only the device whose address is contained in the message may respond. This methodology prevents data collisions thereby mitigating the loss of data. The format and commands used in the data communications protocol are described below.

All devices in the system are capable of decoding digital messages conforming to this protocol. In addition, each device may operate as both a controller and as a slaved device. This allows the system to relay messages between devices that might otherwise be out of the direct radio communication range.

The present invention also uses file and data formats and file naming conventions conforming to the IEEE C37.111-1992 "Standard Common Format for Transient Data Exchange (COMTRADE) for Power Systems."

Also, the present invention allows for its instrument and/or analysis software to be updated without removing the apparatus from the power conductor. Such software updates could be uploaded to the housing through the communications transceiver and stored in on-board memory and/or used by the processors.

Power System

Figure 3:
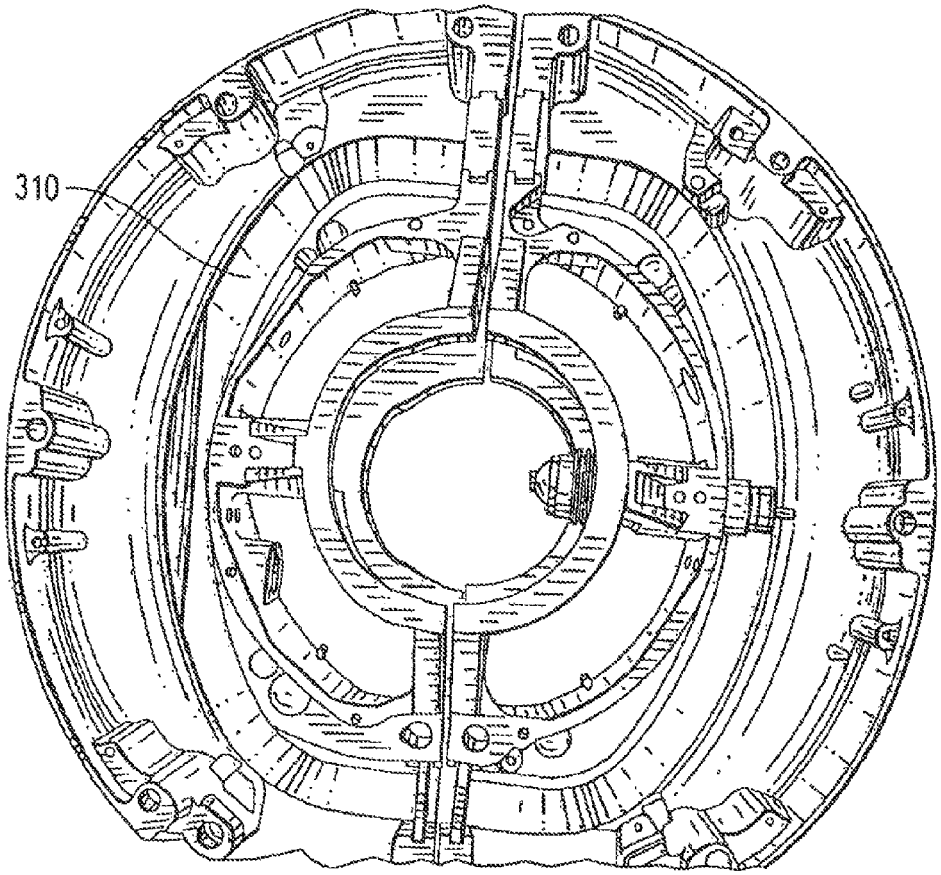
FIG. 3 is a top-view showing the magnetic core mounted in the lower-half shell of the housing of apparatus in accordance with the present invention.
Figure 4:
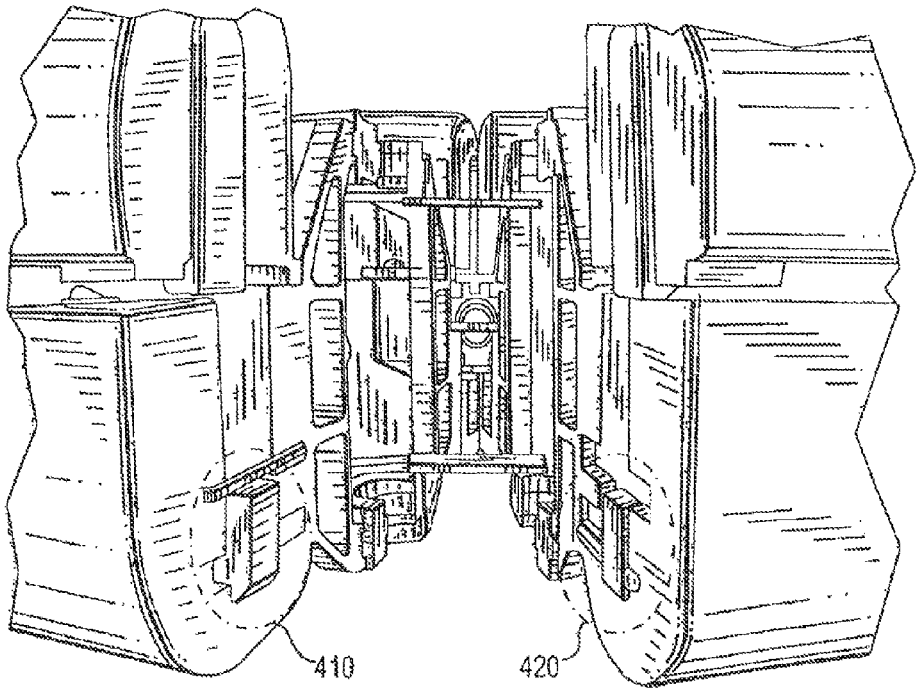
FIG. 4 is a side-view showing the ends of the magnetic core of the apparatus when in the open position.

The present invention derives it primary power from the energized conductor onto which the housing is mounted. The housing contains a magnetic core which is coupled by induction to the electromagnetic field generated when current flows in the power line conductor. FIG. 3 is a top-view showing the magnetic core 310 mounted in the lower-half shell of the housing. The magnetic core extends around the interior of the housing to surround the conductor. The core is divided into two magnetized sections such that opposed pole faces are separated when the housing is "opened" and in contact with each other when the housing is "closed" and mounted onto the conductor. FIG. 4 is a side-view picture showing two ends 410, 420 of the magnetic core of the present apparatus when in the open position. The magnetic core has a minimal set of secondary power pick-off coils and power conditioners that are used to power the components in the housing.

As a secondary power source, the apparatus includes a rechargeable battery to power the components in the housing when there is insufficient or no current flowing through the conductor. FIG. 5 is a top-view showing the battery pack 510 mounted in the upper-half shell of the housing of the present apparatus.

The current level in the conductor is monitored by sensing circuitry in the housing to determine whether the flow is above predetermined minimum threshold values. The apparatus is powered by the battery when the line current is below a first threshold value. If the current flow is above this first threshold, the apparatus may be powered by electromagnetic induction from the conductor. When the current is above a second threshold value, excess induction current is used by a charger in the battery pack 510 to charge the battery. If an insufficient current condition (i.e. below the first threshold) persists in the conductor beyond a predetermined time limit, the apparatus can reduce the frequency of data transmission to conserve battery power. If the battery voltage drops below a second threshold level, all battery-powered transmission is stopped until the battery is recharged.

Because the apparatus is attached directly on the power conductor, and measures current and voltage from the electrical and magnetic field surrounding the conductor, the present invention eliminates the need for many of the auxiliary ground based transformers, transducers, test switches, terminal blocks, fault monitors and hard wiring required in previous power monitoring systems.

II. Data Processing

A. Disturbance Event Processing

The processing performed by the present invention is capable of analyzing instrument inputs to produce at least the following types of disturbance reports:

a. Disturbance location reports based on 60 Hz voltage (V) and current (I) measurements from one end of a line;
b. Disturbance location reports based on the Takagi algorithm using data from one end of a line;
c. Disturbance location reports based on phasor data from both ends of a line;
d. Disturbance location information based on ratios of currents from both ends of a line; and
e. Disturbance location reports based on traveling waves captured at both ends of a line.

The terms disturbance and fault are used interchangeably herein. However, disturbance recording typically requires data acquisition for at least five minutes while fault recording generally captures data over intervals of less than one second. Accordingly, fault recording may be viewed as a subset of disturbance recording.

Because most faults are temporary and the location of a fault is not always easy to find, it is advantageous to have accurate fault location information. Nevertheless, utilities still routinely examine transmission line hardware via helicopters to locate a fault. It often takes a long time to find the site of a fault, even for common problems such as cracked insulators from arc-over due to lightning strikes.

The distance along a transmission line to a fault can be calculated from one end of the line using voltage and current measurements. Fault voltage and current data is used to calculate the reactance from the measuring site to the fault and establish the distance based on the reactance per mile of the transmission line. Reactance is used rather than impedance so as to minimize the effect of fault resistance. However, this technique does not entirely eliminate the effect of fault resistance because of the voltage drop caused by line current flowing into the fault resistance from the other end of the line. The error in this type of calculation can be up to 5 or 10 percent. For example, an error of ±5% on a 100 mile line would be ±5 miles. Although this does limit the search range, a more accurate calculation is needed.

The Takagi algorithm was first published in 1980 and has proven to be quite accurate. This algorithm was first applied in the U.S. in the Schweitzer Distance Relay and remains today the preferred algorithm for fault location based on voltage and current measurements from one end of a line. However, it is still dependent on the accuracy of the voltage and current inputs from one end of the line.

Figure 10:
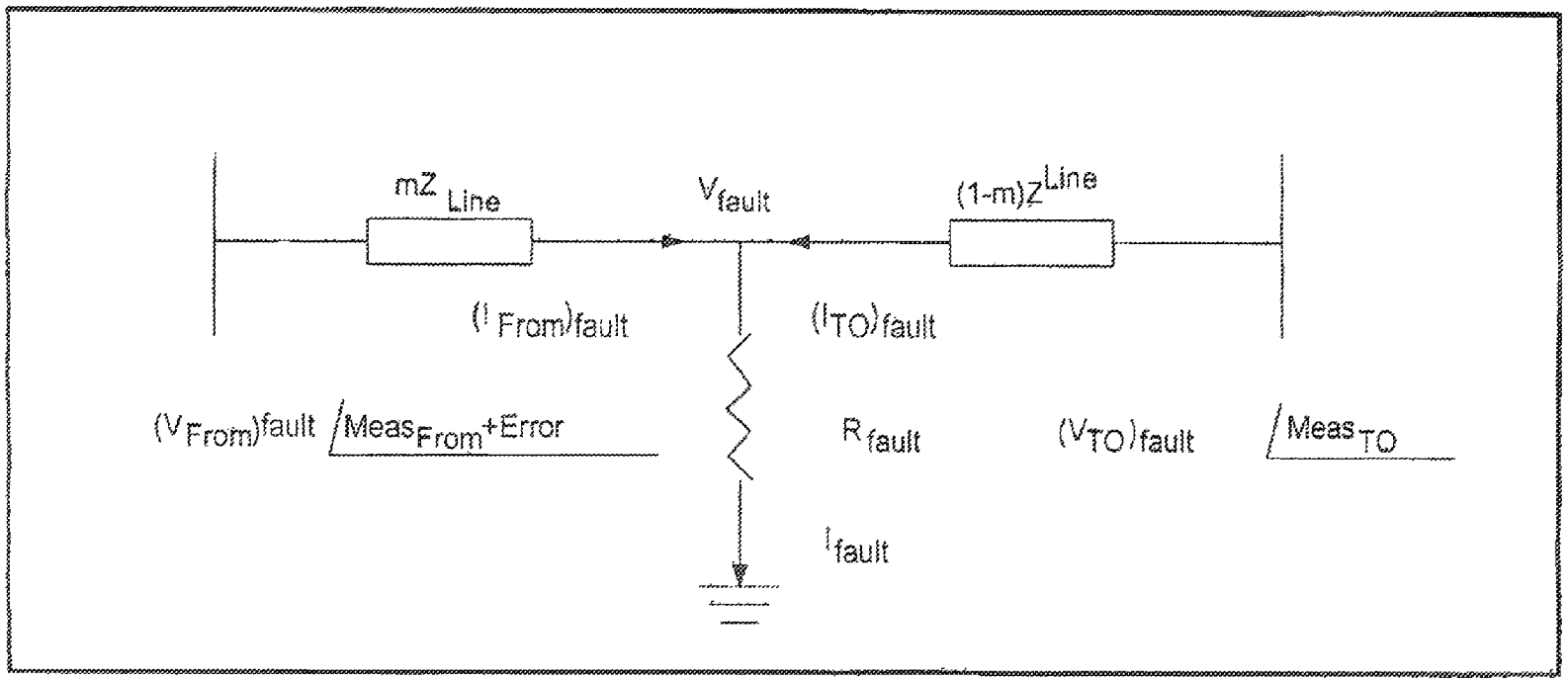
FIG. 10 PRIOR ART
FIG. 10 is a schematic diagram of a conventional transmission line model.

Fault location can also be accurately computed using phasor information from both ends of a transmission line. In this case, the location calculation is independent of the fault resistance and is therefore immune to the effects of out-of-phase sources feeding into the fault. In this calculation, remote phasors are synchronized analytically in a double-ended algorithm, thereby eliminating the need for phasor synchronization. This is accomplished by expressing the voltage angle at one end of the line as a known measured angle plus an unknown synchronization error. Applying this approach to a conventional transmission line model, as shown in FIG. 10, results in three unknown parameters: the synchronization angle (error), the location of the fault (m), and the fault resistance ($R_{fault}$). FIG. 10 shows that the fault voltage ($V_{fault}$) can be expressed by two equations written in terms of the fault current flowing from each terminal of the line $(I_{From})_{fault}$ and $(I_{TO})_{Fault}$. The resistance can be eliminated mathematically from these equations by equating the two expressions in terms of the fault voltage. Separating the complex equations into real and imaginary parts results in two equations with two unknown parameters: the synchronization error between the remote measurements and the fault location. Both of the unknown parameters can be computed using the two equations.

Another method for calculating fault location, especially for longer transmission lines (over 300 miles), is based on the ratios of the currents feeding into the fault as measured from both ends of the line. A fault in the center of the line would result in the some current at both ends. This calculation must also take into account the impedance to the generating sources at each end of the line and the current measurements must be corrected for offset.

The distance to a fault can also be determined by capturing a traveling wave at both ends of the line. Lightning strikes are a common cause of traveling waves on transmission lines. Typically, the waveform of a lightning surge voltage on a high voltage power transmission line flattens as the voltage surge travels further along the transmission line. The conventional method for picking up traveling waves is to use an inductor or high frequency transformer in series with a voltage connection between the power line and the case of the measuring instrument. However, in the present invention, the voltage waveform is monitored by means of capacitive coupling. The apparatus may include a conductor to short (or alternatively, a capacitor to couple) the power line to the housing. Current will flow out from the housing to ground in proportion to the surface area of the housing. The voltage may be measured from this current flow.

B. Data Acquisition Triggering Schemes

A triggering mechanism is required to capture fault current and voltage waveforms. The trigger mechanism should be based on a change from a zero state to some value (referred to as all-or-nothing sensing) rather than on particular signal levels because the operating conditions of the line demand different level settings for different operating conditions.

One method used in the present invention is to trigger far-end fault data capture upon a current reversal of the current direction to feed the fault. This method requires a phase comparator to compare the previous cycle with the current cycle on a rolling half cycle basis. In this situation, fault data is only needed at one end of the line and therefore eliminates the need to transmit a trigger to the other end. However, triggering must be relayed between all three phases within 5 cycles of 60 Hz in order to capture voltage and current waveforms with at least 5 cycles of pre-fault; assuming that the detecting phase has 10 cycles of pre-fault.

Pre-fault and fault data should be captured with a frequency response of 1200 Hz (or better) in order to capture breaker re-strikes. Any anti-aliasing filters should be of the linear phase response type so as to eliminate overshoot and ringing on step inputs. The corresponding band limits will be at the 6 db points. Sixty cycles of post-fault data should also be captured in order to include the re-close and potential beginning of a power swing, but only the 60 Hz component needs to be recorded. If the fault still exists upon re-closing, the response should revert back to 1200 Hz in the pre-fault and fault interval before dropping back to 60 Hz in the post-fault period.

If a current reversal is detected at both ends of the line, the fault record captured for that line section should be deleted within a second or so after the fault record is captured. Those fault records should be deleted because the fault is not within those line sections that have current reversals at both ends. The fault will be in the Hue section that has a current reversal at one end only. This is a definite improvement over standard fault recorders that capture data at every fault recorder site. It then becomes necessary to find the record that is closest to the fault for analysis.

The present invention may additionally, or alternatively, use one or more of the following triggering methods:

- capture data following a fault to obtain data on instabilities;
- use a timed impedance trajectory instrument for power swings;
- trigger on under-frequency fur under-frequency conditions;
- trigger on timed positive sequence under-voltage for voltage collapse; and
- trigger on period jumps in 60 Hz waveforms to capture data on power redistributions following a reconfiguration of the system after a fault or loss of generation or transmission. A change in system configuration causes a change in voltage angle at every node in the system so as to conform to the new conditions for power flow.

C. Real Time Voltage Phase Angle Measurements

The present invention measures the voltage phase angle once a second and transmits it to an operations center on a real time basis. The angle is determined by recording the time difference between the exact time [to a resolution of 10 microseconds (0.22 degrees of 60 Hz)] of the measurement to the next positive zero crossing of the voltage waveform. Simultaneous measurements could be taken at both ends of the line to determine the phase angle from one end of the line to the other.

The voltage phase angle M may be calculated from the power flow P by solving the following equation:

$$P=V_S V_R \sin(M)/X$$

where $V_S$ and $V_R$ are the sending and receiving end voltages, X is the reactance between these two voltages, and M is the angle by which $V_S$ leads $V_R$.

D. Power Swing Measurements

Ideally, disturbance recorders should be installed at every backbone interconnection between the 10 NERC (North American Electric Reliability Council) regions in the U.S. in order to rapidly analyze disturbances and improve reliability. This need has been largely ignored over the past two decades because utilities have no incentive to improve system reliability and consistently face obstacles to new transmission lines and generating plants. System disturbances can be described as: power swings, out-of-step conditions, load shedding, or voltage collapse.

Shocks to a transmission system may be caused by faults, loss of generation, or tripping a line. Such shocks may cause power swings (oscillations) whereby power flows back and forth through a line. Power swings may be a short duration "instability" swing which quickly normalizes or a sustained "oscillation" in the bus voltage and line current. Data on the character, duration, and period of a power swing is valuable in preventing future power swings. Power swings are often relatively slow events, typically having a period of around 15-20 cycles of 60 Hz. For example, the power may propagate in one direction for a period of 15 cycles and then back in the other direction for 15 cycles. It is only necessary to record the RMS (root mean squared) current values of each cycle of 60 Hz. Recording should continue for one or two minutes, or until the power swing stops.

If allowed to continue, a power swing may result in an out-of-step condition when one or more generators slip a pole. This out-of-step condition severely strains generator shafts and affected machines must be inspected for damage. Generators typically include damping to prevent such oscillations, but the required damping factors are not known to a high degree of certainty. The data collected for a power swing will indicate the degree of damping applied.

An under-frequency condition occurs when there is insufficient power to supply the existing load. This occurs when a major source of power is lost; such as when a major line trips out or a major generator drops off line. Under such conditions, load shedding is practiced in order to preserve balance in the system. Frequency relays are used to trip out sections of load at particular frequencies as the frequency decreases. For example, the first relay might trip out at 59.8 Hz, the second at 59.4 Hz and a third at 59.2 Hz. Shedding continues until the frequency begins increasing back towards 60.0 Hz. The frequency is typically recorded to an accuracy of 0.01 Hz in order to verify the performance of the load shedding relays.

When a line trips out, the operator reconfigures the system and reroutes power over the new system configuration. To increase the transmission capacity of a system, capacitors have been installed on many transmission lines. However, these lines are more sensitive to an overload, which in turn makes the system more susceptible to a voltage collapse. It is therefore important to monitor line loading and voltage levels throughout a power system so that cascading events, such as a voltage collapse, can be understood and prevented.

E. Data Acquisition for Fault Location

As discussed previously, the present invention may acquire disturbance/fault location data based on a method of capturing the arrival time (to the nearest microsecond) of traveling waves at both ends of a line section. The critical factors in this method are to provide accurate time synchronization between the ends and inter-end communication. A GPS receiver may be used for the time synchronization by combining the "time of day" serial message and the 1 pps time strobe in the GPS signal. The inter-end communication can be by any convenient means and does not have to be in real time.

The distance to the fault from the two ends of a line section are given by:

$$\text{Distance from end A}=(\text{linelength}/2)+(T1A-T1B)*V/2$$

$$\text{Distance from end B}=(\text{linelength}/2)+(T1B-T1A)*V/2$$

wherein the distance is calculated in miles; linelength is the length of the line section in miles; A and B designate each end of the line segment; T1A and T1B represent the respective arrival times at each end for the first occurrence of the traveling wave; and V is the speed of light (186,280 miles per second).

The present invention uses a Rogowski coil to pickup the current signal in the line section. The current, rather than the voltage, should be used to detect the traveling wave. The magnitude of the current signal will be the value of the voltage wave divided by the characteristic impedance of the power line (approximately 500 ohms).

The current signal is converted to voltage and passed through a 30 kHz single pole, high pass filter. The signal is then clipped to prevent overdriving the system's electronics. The signal passes through a 350 kHz single pole low pass filter to limit the bandwidth for an improved signal to noise ratio. Note, a 350 kHz filter is used to pass one microsecond rise time pulses, which roughly correspond to the distance between transmission towers.

The pulse detection circuit should include an adjustable threshold detector to permit triggering on the lowest expected input current for the traveling wave. Primary current pulse magnitudes on a 345 kv line (200 kv to ground) should range between 56 and 400 amperes depending on how far the fault is located from the end of the line; assuming a 100 mile section. The magnitude of a voltage pulse versus distance is given by the following formula:

$$E=E_0/(KSE_0+1)$$

wherein $E_0$ is the initial voltage in kilovolts, S is the travel distance in miles, and K is an empirical constant.

Once a pulse has been detected, the pulse detection circuit must lockout for one second to prevent the detection of subsequent reflections and breaker operations. It should be noted that traveling waves could be generated by switching operations and faults outside the monitored section. Therefore a means must be provided to verify that the detected waves are from a fault in the section of line being monitored.

To verify that a fault did in fact occur within the monitored line section, a phase comparison scheme is recommended. The phase comparison technique compares the arrival times of the first positive zero crossing of the current waveform at each end of the line following the receipt of a traveling wave. If the fault is within the monitored section of line, the times will be nominally different by 180 (+/−90) degrees of 60 Hz. The 180 degree difference stems from current being fed from both ends of the line into the fault. Otherwise, the currents at both ends would be in phase. It is expected that the phase information can be communicated from one end of the line to the other within a second. This will allow for verification of the fault around the time the pulse detectors' one-second-lockout interval ends.

III. Disturbance Reports

Ideally, a system operator will receive a complete disturbance report after a fault occurs so that repair crews can be informed and dispatched. Unfortunately, prior art fault recording devices can only provide records consisting of traces of 60 Hz waveforms for the relay engineers to analyze. Clearly defined fault information sets, such as listed below, are generally not available until the relay engineers analyze these traces.

Advantageously, the present invention can capture fault data waveforms and perform an automatic analysis on the data so as to extract the information required for a fault report. As discussed above, this analysis is performed by software running on one or more processors in the apparatus. The present invention can provide disturbance reports which include the following fault data:

1. Date and time of fault (e.g. to the nearest second)
2. Nature of fault (e.g. temporary or permanent)
3. Type of fault:
   a. Three-phase
   b. Phase-to-phase (e.g. 1-2, 2-3, 3-1)
   c. Two phase-to-ground (e.g. 1-2-G, 2-3-G, 3-1-G)
   d. Phase-to-ground (e.g. 1-G, 2-G, 3-G)
4. Maximum fault amperage
5. Time to clear the fault (e.g. in cycles of 60 Hz)
6. Damage estimate (e.g. low, medium, high)

A fault should be considered permanent if the fault still exists upon re-closing the line. The fault is considered temporary if it is not present upon re-closing. Re-closing may be automatic or manual. Manual re-closing is preferable for extremely high voltage lines where re-closing on a fault could cause significant damage. As used herein, re-closing refers to the act of resetting, reconnecting, and/or re-powering a line after the line has been opened such as when a fault occurs which trips a breaker/relay in the line.

The type of fault can be ascertained by noting which phases have fault current. The presence of a zero sequence component during the fault indicates that a ground is involved in the fault. A zero sequence is computed as follows:

$E_0=(E_a+E_b+E_c)/3$ where a, b, c, each represent a phase

The maximum fault amperage is determined by which phase has the maximum current during the fault. The time to clear the fault is the time interval from the beginning of the fault current to when the fault current is no longer present (i.e. a breaker is open). Damage estimates can be made by calculating a value $KA^2$, where K is the number of cycles to clear the fault and A is the value of fault amperes (in 1,000 s). This value is correlated to an expected level of damage which allows a dispatcher to tell a repair crew what to expect at the fault site.

IV. Data Communications Protocol

Introduction

This section describes the data communications protocol used by the present invention. Data exchange can occur between: two apparatus (electrical instrument platforms); an apparatus and a ground station; and between processors (microcontrollers) within an apparatus. For example, the power supply's processor may communicate with the main board's processor.

The apparatus normally communicates using wireless radio communication systems. A hard-wired connection is provided for configuration and maintenance purposes via a "Configuration and Test" port. This port uses a three wire version of the RS 232 signal format (see Tables 1A and 1B) to connect with a laptop computer. This port is used when the wireless system in the electrical instrument platform is a cellular-based telecommunication system.

TABLE 1A

| Computer with DB25 Connector RS232 Pin Assignments (DB25 PC signal set) | |
|---|---|
| Pin 1 | Protective Ground |
| Pin 2 | Transmit Data |
| Pin 3 | Received Data |
| Pin 4 | Request To Send—Not Required |
| Pin 5 | Clear To Send—Not Required |
| Pin 6 | Data Set Ready—Not Required |
| Pin 7 | Signal Ground |
| Pin 8 | Received Line Signal Detector (Data Carrier Detect)—Not Required |
| Pin 20 | Data Terminal Ready—Not Required |
| Pin 22 | Ring Indicator—Not Required |

TABLE 1A

| Computer with DB9 Connector RS232 Pin Assignments (DB9 PC signal set) | |
|---|---|
| Pin 1 | Received Line Signal Detector (Data Carrier Detect)—Not Required |
| Pin 2 | Received Data |
| Pin 3 | Transmit Data |
| Pin 4 | Data Terminal Ready—Not Required |
| Pin 5 | Signal Ground |
| Pin 6 | Data Set Ready—Not Required |
| Pin 7 | Request To Send—Not Required |
| Pin 8 | Clear To Send—Not Required |
| Pin 9 | Ring Indicator—Not Required |

Conventions And Terminology

The following conventions are used throughout this specification:

1. Single ASCII characters are enclosed in single quotes;
2. ASCII strings (two or more characters) are enclosed in double quotes; and
3. HEX values are preceded by 0x.

Communicating devices, such as main controllers, power supply controllers, maintenance laptop computers, ground stations or "master stations" are each referred to herein as communicating "units". Communications occur when an "external" unit transmits a message to a "receiving" unit. Messages may be "requests" for data, or may be "commands" to cause the receiving unit to take some action such as change configuration parameters, reset the internal clock, etc. . . . .

Data Transpon Link Format

Device Identification

Each electrical instrument platform "unit" is assigned a unique base address, which is downloaded into the devices' firmware. The address is a fifteen (15) bit quantity transmitted as four ASCII character bytes. The address settings are selected as HEX numerals starting at 1 (one) up to 7FFF (representing 32,767 possible addresses). The upper bit is reserved for data routing within the device.

Data Link Format

The protocol uses a 10 bit character frame. The default communications setup is:

Baud Rate: up to 115 kbaud
Start Bits: 1
Data Bits: 8
Stop Bits: 1
Parity: None

Data Transport Session Control

The electrical instrument platform employs a point to is multi-point communications protocol. The system design assumes one master controlled as an "external" unit. One master controller can communicate with multiple recipients.

Data transport sessions begin when the external unit polls a recipient unit. The polled device responds when its unique address is detected in the poll message. The response includes the recipient's address. It is assumed that there is only one external device to receive the message.

The electrical instrument platform microcontrollers process one command at a time. If a laptop computer is connected to the field test port, there is a possibility that commands could arrive on both the wireless port and the field test port at the same time. In that case, the processor will handle a message from the first port, complete the message turn-around before processing a message on a second port. The ports are scanned sequentially.

Data Interchange Format

Data is transmitted as a comma-delimited, ASCII-encoded HEX string formatted record. The ASCII string is transmitted as a continuous string with no extra spaces, carriage returns or form feeds between characters.

Data Format—General

The data message is defined by the packet format shown in Table 2 below. Each device is permitted to maintain specific information in each field of its message.

TABLE 2

Protocol Format Generic Structure

| # Bytes | Context | Values: ASCII | HEX | Description |
|---|---|---|---|---|
| 1 | <STX> | Cntl B | 0x02 | Start of Message Packet |
| 4 | AAAA | "1"-"FFFF" | 0x31-0x46464646 | 16 Bit Device Address |
| 1 | delimiter | ',' | 0x2C | ASCII comma field delimiter |
| 1-m | Field 1 | | | Variable length data field |
| 1 | delimiter | ',' | 0x2C | ASCII comma field delimiter |
| 1-m | Field 2 | | | Variable length data field |
| 1 | delimiter | ',' | 0x2C | ASCII comma field delimiter |
| 1-m | Field n | | | add additional fields with delimiter |
| 1 | delimiter | ',' | 0x2C | ASCII comma field delimiter |
| 2 | CS | "00"-"FF" | 0x3030-0x4646 | 8 Bit checksum calculation |
| 1 | <EOT> | Cntl D | 0x04 | End of Text Character |

Notes:

1. The checksum is the MOD 256 addition of the characters in the message, including the first Byte <STX>.
2. The address field contains the ordinal value of the HEX address. For example, if the unique address is HEX '1', the return address field from the IED will contain the ASCII representation for the HEX value 1, which is "1" or 0x31.

Message Formats

The electrical instrument platform incorporates several microcontrollers that communicate with each other. Communications dialog consists of requests and commands. A request is a message code that causes the recipient to send a particular data block. A command is a message that instructs the recipient to carry out a specific activity. Table 2.6 is a list of the valid message codes.

Message Routing

Message Addressing

The power supply controller hoard has three ports:

The "radio" port that is normally used for external communications. The radio port is used by the spread spectrum radios and also the cell-phone radio.

The "Field Test and Maintenance" port is used for external communications. The field test port allows a laptop computer to be connected with the electrical instrument platform for field setup and testing. The field test port can be active at the same time as the radio port.

The inter-processor communications port. This port connects the power supply controller with the Main Controller.

Message routing is controlled by the power supply and communications expansion controller. This controller and the main controller both have the same 16 bit address. When bit 16 of the address is set, the message is routed to the power supply controller. When bit 16 is clear, the message is routed to the main controller.

Message Sequencing

Message transactions are processed sequentially, one message transaction at a time. When a message arrives at the power supply controller, whether it is routed to the main controller or to itself, its complete process shall be completed before a second message can be processed. Should a second message arrive before the response has been transmitted for the first message, the second message shall be held in a wait buffer until the first transaction has been completed.

TABLE 3

Valid Message Codes

| # Bytes | Context | Values: ASCII | HEX | Description |
|---|---|---|---|---|
| 1 | <STX> | Cntl B | 0x02 | Start of TNP Message Packet |
| 4 | AAAA | "0001"-"FFFF" | 0x30303031-0x46464646 | 16 Bit Device Address |
| 1 | delimiter | ',' | 0x2C | ASCII comma field delimiter |
| 2 | Poll Type | "AA" | 0x41 0x41 | Analog Alarm Configuration Command |
| 2 | Poll Type | "AC" | 0x41 0x43 | Analog Configuration Request |
| 2 | Poll Type | "AD" | 0x41 0x44 | Address Configuration Command |
| 2 | Poll Type | "AH" | 0x41 0x48 | Analog Historical Data Request |
| 2 | Poll Type | "AN" | 0x41 0x4E | Analog values data request |
| 2 | Poll Type | "AR" | 0x41 0x52 | Analog Alarm Report From Main Controller |
| 2 | Poll Type | "AS" | 0x41 0x53 | Autoscaling Command |
| 2 | Poll Type | "BC" | 0x42 0x43 | Battery Charger threshold config Reg/Com |
| 2 | Poll Type | "CA" | 0x43 0x41 | Offset Calibration Command |
| 2 | Poll Type | "DC" | 0x44 0x43 | Discretes Configuration Req/Com |
| 2 | Poll Type | "DI" | 0x44 0x49 | Report Discrete Input Status |
| 2 | Poll Type | "EN" | 0x45 0x4E | Energy Data Request (kW/kVar) |
| 2 | Poll Type | "FT" | 0x46 0x54 | Send FFT Coefficients |
| 2 | Poll Type | "GP" | 0x47 0x50 | Send Power Supply Data Main to Power Board |
| 2 | Poll Type | "GS" | 0x47 0x53 | Got Discrete Alarm Status From Main Controller |
| 2 | Poll Type | "HD" | 0x48 0x44 | Erase Historical Data Command |
| 2 | Poll Type | "LO" | 0x4C 0x4F | Start Loader Command |
| 2 | Poll Type | "MA" | 0x4D 0x41 | Metering Alarm Configuration Command |
| 2 | Poll Type | "MC" | 0x4D 0x43 | Metering Configuration Req/Com |
| 2 | Poll Type | "MH" | 0x4D 0x48 | Meter historical Data Request |

TABLE 3-continued

| Valid Message Codes | | | | |
|---|---|---|---|---|
| # | | Values: | | |
| Bytes | Context | ASCII | HEX | Description |
| 2 | Poll Type | "MS" | 0x4D 0x53 | Meter Analog Alarm Status from Main Controller |
| 2 | Poll Type | "OL" | 0x4F 0x47 | Communications On Line Status Report |
| 2 | Poll Type | "PC" | 0x50 0x43 | Serial Port Configuration Req/Com |
| 2 | Poll Type | "RS" | 0x52 0x53 | Reset all Accumulated(s) kWhr etc |
| 2 | Poll Type | "SA" | 0x53 0x41 | Save Configuration Command |
| 2 | Poll Type | "SC" | 0x53 0x43 | Site Specific Configuration Req/Com |
| 2 | Poll Type | "SN" | 0x53 0x4E | Unit Serial Number Request |
| 2 | Poll Type | "SP" | 0x53 0x50 | Send Power Supply Data Power Board to Main |
| 2 | Poll Type | "TS" | 0x54 0x53 | Time Sync |
| 2 | Poll Type | "WA" | 0x57 0x41 | Send Amp Waveform |
| 2 | Poll Type | "WC" | 0x57 0x43 | Waveforms Configuration Req/Com |
| 2 | Poll Type | "WV" | 0x57 0x56 | Send Voltage Waveform |
| 1-m | Opt. flds. | | | additional fields with delimiters before and after |
| 2 | Chcksum | "00"-"FF" | 0x3030-0x4646 | 8 Bit checksum calculation |
| 1 | <EOT> | Cntl D | 0x04 | End of Text Character |

Outgoing messages are always routed through the same port that they are entered through. This means that when a "radio" port message is received by the power supply controller, the response is sent out of the same port. When a message is received on the field test and maintenance port, the response is routed out of that port. When a message arrives on the radio port at the same time that a message is being processed via the field test and maintenance port, the radio port message is held in the waiting buffer until the currently processing message transaction is completed.

Error Handling

If a received message is corrupted, the recipient should reject the data string as not conforming to specifications. This may occur for one of two reasons:

1. Two devices have been provided with the same address;
   Corrective Action: Change one of the devices address.
2. The poll message originating with the ground station was corrupted after reception by the first device;
   Corrective Action: Retry the poll message.

Specific Message Formats

Data Message Description

The electrical instrument platform message, in addition to its 16 bit device address, provides the following data in its message packet response to the unique address poll:

AN—Analog Data Request

The Analog Data Request can be initiated by any microcontroller in the system. The recipient decodes the message, and responds with a valid data block.

poll→<STX>address, AN, {start channel}, {end channel}, CS<ETX> valid channels are 0 to 26 (for a list of the channel assignments see io_chan.h)

start channel must be less than end channel if the start channel field is empty, the start channel will be the first analog input channel, channel 0 if the end channel field is empty, the end channel will be the last analog input channel, channel 25 response→<STX>address, AN, start channel, end channel, first requested channel value, . . . , last requested channel value, CS<ETX> values are floating point any channels not enabled in the configuration are empty ME—Metering Data Request The Metering Data Request can be initiated by any microcontroller in the system. The recipient decodes the message, and responds with a valid data block.

poll→<STX>address, ME, CS<ETX> response→<STX>address, ME, voltage, current, watts, vars, phase angle, CS<ETX>

EN—Energy Data request

The Energy Data Request can be initiated by any microcontroller in the system. The recipient decodes the message, and responds with a valid data block.

poll→<STX>address, EN, CS<ETX> response→<STX>address, EN, Whr in, V Arhr in, Whr out, V Arhr out, CS<ETX> any channels not enabled are empty

DI—Digital Data Request

The Discrete Input Data Request can be initiated by any microcontroller in the system. The Recipient decodes the message, and responds with a valid data block.

poll→<STX>address, DI, {start channel}, {end channel}, CS<ETX> valid channel numbers are 0 to 27 (0 to 26 are actual digital inputs; 27 is the battery charger error status)

start channel must be less than end channel if start channel is empty, then the start channel is 0 if end channel is empty, then the end channel is 27 response→<STX>address, DI, first requested channel value, . . . , last requested channel value, CS<ETX> values are 0 or 1 channels that are not enabled in the configuration are empty

TS—Time Synch Command

The Time Sync Command can be initiated by any microcontroller in the system. The recipient resets its real time clock using the data in the message, and responds with an ACK (acknowledged) or NAK (not acknowledged).

poll→<STX>address, TS, year, month, day, hour, minute, second, millisecond, CS<ETX> the year is 2 digit response→ACK or NAK

RS—Reset Accumulators Command

The Reset Accumulators Command can be initiated by any microcontroller in the system. The Recipient resets its energy accumulators, and responds with an ACK or NAK.

poll→<STX>address, RS, CS<STX> response→ACK or NAK

FT—FFT Coefficients Request not programmed

WV—Voltage Waveform Request not programmed

WA—Current Waveform Request not programmed

AH—Historical Data Request

The Analog History Data Request can be initiated by any microcontroller in the system. The recipient responds with the data block requested.

poll→<STX>address, AH, channel, number of values, start year, start month, start day, start hour, start minute, CS<ETX> valid channel numbers are 0 to 26;

requests X number of values starting at (and including) the start time and going back in time (reverse chronological order); e.g., <STX>address, AH, 0, 3, 4, 4, E, 2, 2D, CS<ETX>will return (with a logging interval of 15 minutes) the three values for channel 0 for Apr. 14, 2004 at 2:45, 2:30 and 2:15 in that order;

the time is optional (all or nothing—all time fields fill in or none of them)—if empty, the start time is the time of the most recent logged value for the channel;

maximum number of values returned is 50 (it accepts requests for more but will only return 50).

response→<STX>address, AH, channel, logging interval, number of values, start year, start month, start day, start hour, start minute, most recent value, . . . , least recent value, CS<ETX> maximum of 50 values in the response, regardless of the number requested;

the number of values may be less than the number requested if the number of values requested is less than the number of values available (e.g. asking for older data than is stored in the device).

MH—Metering Historical Data Request

The Metering History Data Request can be initiated by any microcontroller in the system. The recipient responds with the data block requested.

poll→<STX>address, MH, channel, number of values, start year, start month, start day, start hour, start minute, CS<ETX> channels are: voltage=0, current=1, watts=2, vars=3, phase angle=4.

response→<STX>address, MH, channel, logging interval, number of values, start year, start month, start day, start hour, start minute, CS<ETX>

HD—Delete Historical Data Command

The Delete Historical Data Command can be initiated by any microcontroller in the system. The recipient responds with and ACK for success or NAK for failure to carry out the command. The main controller deletes the specified historical data.

poll→<STX>address, HD, CS<ETX> response→ACK if ok

SN—Serial Number Request

The Serial Number Request can be initiated by any microcontroller in the system. The recipient responds with the data block requested.

poll→<STX>address, SN, CS<ETX> response→<STX>address, SN, serial number, CS<ETX>

AD—Address Configuration Command

The Address Configuration Command can be initiated by any microcontroller in the system. The recipient responds with and ACK for Success or NAK for failure to carry out the command. Both the main controller and the power supply controller change their communications address in response to this command.

poll→<STX>address, AD, new address, CS<ETX> response→ACK note that the address in the ACK message is the old address.

AC—Analog Configuration Request

The Analog Configuration Request can be initiated by any microcontroller in the system. The recipient responds with the data block requested.

request→analog configuration poll→<STX>address, AC, channel, CS<ETX> channel is 0 to 26.

response→<STX>address, AC, channel, logging interval, channel enabled, multiplier, offset, upper bound engineering, lower bound engineering, CS<ETX> channel enabled value is 0 for not enabled, 1 for enabled;

logging interval is integer, all conversion fields are floating point;

conversion fields may be empty, for example, if the conversion uses a multiplier and offset then upper and lower bound fields will be empty and if the conversion uses upper and lower bounds, the multiplier and offset fields will be empty;

if all conversion fields are empty it assumes a multiplier of 1 and an offset of 0 (no upper and lower bounds);

logging intervals are in minutes. A 0 in this field or an empty field means that the channel is not logged;

valid logging intervals are 1, 5, 10, 15, 30 and 60 minutes.

AC—Set Analog Configuration Command

The Analog Configuration Command can be initiated by any microcontroller in the system. The recipient accepts the input data block to replace the current configuration information.

poll→<STX>address, AC, channel, logging interval, channel enabled, multiplier, offset, upper bound engineering, lower bound engineering, CS<ETX> response→ACK or NAK

MC—Metering Configuration Request

The Metering Configuration Request can be initiated by any microcontroller in the system. The recipient responds with the data block requested.

request→metering configuration poll→<STX>address, MC, CS<ETX> response→<STX>address, MC, volts logging interval, volts multiplier, volts offset, volts upper bound engineering, volts lower bound engineering, current logging interval, current multiplier, current offset, current upper bound engineering, current lower bound engineering, watts logging interval, watts multiplier, watts offset, watts upper bound engineering, watts lower bound engineering, vars logging interval, vars multiplier, vars offset, vars upper bound engineering, vars lower bound engineering, phase angle logging interval, voltage gain, current gain, fall scale input, line frequency, phase angle error, CS<ETX> voltage gain, current gain, full scale input and line frequency are integers, everything else is the same as in the analog configuration message.

MC—Set Metering Configuration Command

The Metering Configuration Command can be initiated by any microcontroller in the system. The recipient accepts the input data block to replace the current configuration information.

poll→<STX>address, MC, volts logging interval, volts multiplier, volts offset, volts upper bound engineering, volts lower bound engineering, current logging interval, current multiplier, current offset, current upper bound engineering, current lower bound engineering, watts logging interval, watts multiplier, watts offset, watts upper bound engineering, watts lower bound engineering, vars logging interval, vars multiplier, vars offset, vars upper bound engineering, vars lower bound engineering, phase angle logging interval, voltage gain, current gain, full scale input, line frequency, phase angle error, CS<ETX> response→ACK or NAK

EC—Energy Configuration Request

The Energy Configuration Request can be initiated by any microcontroller in the system. The recipient responds with the data block requested.

request→energy configuration poll→<STX>address, EC, CS<ETX> response→<STX>address, EC, logging interval, Whr in enabled, V Arhr in enabled, Whr out enabled, V Arhr out enabled, reset time year, reset time month, reset time day, reset time hour, reset time minute, reset time second, CS<ETX>

0 for not enabled, 1 for enabled;

logging interval is for future use;

reset time is for all accumulated values and is defined by filling in the appropriate fields;

filling in month, day, hour, minute and second will cause accumulators to reset yearly on the given day and time;

filling in day, hour, minute, second will cause accumulators to reset monthly on the given day and time;

filling in hour, minute, second will cause accumulators to reset daily at the given time;

filling in all of the time fields, including the year, will cause it to reset only once.

EC—Set Energy Configuration

The Set Energy Configuration Command can be initiated by any microcontroller in the system, The recipient accepts the input data block to replace the current configuration information.

poll→<STX>address, EC, logging interval, Whr in enabled, V Arhr in enabled, Whr out enabled, V Arhr out enabled, reset time year, reset time month, reset time day, reset time hour, reset time minute, reset time second, CS<ETX> response→ACK or NAK

DC—Configuration Request

The Digital Configuration Request can be initiated by any microcontroller in the system. The recipient responds with the data block requested.

request→digital configuration poll→<STX>address, DC, CS<ETX> response→<STX>address, DC, channel 0 logged, channel 1 logged, . . . channel 27 logged, CS<ETX>

0 for not logged, 1 for logged.

DC—Set Digital Configuration

The Set Digital Configuration Command can be initiated by any microcontroller in the system. The recipient accepts the input data block to replace the current configuration information.

poll→<STX>address, DC, channel 0 logged, channel 1 logged, . . . , channel 27 logged, CS<ETX> response→ACK or NAK

WC—Waveform Capture Configuration Request not programmed

WC—Waveform Capture Configuration Command not programmed

PC—Serial Port Configuration Request

The Serial Port Configuration Request (for the extra port, not the radio port) can be initiated by any microcontroller in the system. The recipient responds with the data block requested.

request→serial port configuration poll→<STX>address, PC, port, CS<ETX> response→<STX>address, PC, port, baud rate, parity, data bits, stop bits, CS<ETX> port is always 1;

if the port is not in use then all of the setup fields are empty;

parity is 0 for even, 1 for odd and 2 for none;

data bits are 7 or 8;

stop bits are 1 or 2.

PC—Set Serial Port Configuration

The Set Serial Port Configuration Command can be initiated by any microcontroller in the system. The recipient accepts the input data block to replace the current configuration information.

poll→<STX>address, PC, port, baud rate, parity, data bits, stop bits, CS<ETX> response→ACK or NAK

SC—Site Specific Configuration Request

The Site Specific Configuration Request can be initiated by any microcontroller in the system. The recipient responds with the data block requested.

request→site specific configuration poll→<STX>address, SC, CS<ETX> response→<STX>address, SC, voltage multiplier, phase angle offset, CS<ETX> floating point engineering values.

SC—Set Site Specific Configuration

The Set Site Specific Configuration Command can be initiated by any microcontroller in the system. The recipient accepts the input data block to replace the current configuration information.

poll→<STX>address, SC, voltage multiplier, phase angle offset, CS<ETX> response→ACK or NAK

BC—Battery Charger Threshold Configuration Request

The Battery Charger Threshold Configuration Request can be initiated by any microcontroller in the system. The recipient responds with the data block requested.

request→battery changer configuration poll→<STX>address, BC, CS<ETX> response→<STX>address, BC, battery changer threshold, CS<ETX> floating point engineering value.

BC—Set Battery Charger Configuration

The Set Battery Charger Configuration Command can be initiated by any microcontroller in the system. The recipient accepts the input data block to replace the current configuration information.

poll→<STX>address, BC, battery changer threshold, CS<ETX> response→ACK or NAK

CA—Offset Calibration Command

The Set Offset Calibration Configuration Command can be initiated by any microcontroller in the system. The recipient accepts the input data block to replace the current configuration information.

poll→<STX>address, CA, CS<ETX> perform a calibration.

response→ACK or NAK or, poll→<STX>address, CA, 0, CS<ETX> reset voltage and current offsets to 0.

response→ACK or NAK

LO—Start Loader Command

The Start Loader Command can be initiated by any microcontroller in the system. The recipient accepts the input data block to replace the current configuration information.

poll→<STX>address, LO, CS<ETX> response→sends an ACK then starts the loader

SA—Save Configuration Command

The Save Configuration Command can be initiated by any microcontroller in the system. The recipient accepts the input data block to replace the current configuration information.

poll→<STX>address, SA, CS<ETX> saves the configuration to EEPROM.

response→ACK or NAK

AS—Autoscaling Configuration Command

The Autoscaling Configuration Command can be initiated by any microcontroller in the system. The recipient accepts the input data block to replace the current configuration information.

poll→<STX>address, AS, volts engineering, current engineering, CS<ETX> performs autoscaling.

response→ACK or NAK

SP—Send Power Supply Data Command

The Send Power Supply Data request is initiated by the power supply controller and is sent to the main controller.

poll→<STX>address, SP, power supply voltage, power supply temperature, shunt voltage, CS<ETX> from power supply to main controller;

response→<STX>address, SP, CS<ETX> from main controller to power supply;

all values are 16 bit integer "raw" readings.

GP—Get Power Supply Data Command

Receives Power Supply data from the main controller (for verification).

Command: "GP"

Data: None

Response: "GP"

Data: Power supply voltage (16-bit raw reading)

Power supply temperature (16-bit raw reading)

Shunt voltage (16-bit raw reading)

GS—Get Main Controller Status Request

Returns alarm and other status information from the main controller. The power supply controller polls the Main controller, which returns the data to the power supply:

poll→<STX>address, GS, CS<ETX>—from power supply to main controller response→<STX>address, GS, X, CS<ETX> where X is 0 for no alarms, 1 if there is an alarm. The power supply needs only the presence or absence of alarms—"call home" or don't call home.

OL—Line Status Report

The power supply needs to send a message to the main controller when it connects to the ground station.

poll→<STX>address, OL, CS<ETX>—from power supply to ground station response→the ACK message AA—Analog Alarm Configuration Command The Analog Alarm Configuration Command is sent from an external processor to provide alarm set up parameters to the main controller.

poll→<STX>address, AA, channel, low alarm level, high alarm level 1, high alarm level 2, high alarm level 3, alarm dead-band, CS<ETX> response→ACK message

MA—Metering Alarm Configuration Command

The Metering Alarm Configuration Command is sent from an external processor to provide alarm set up parameters to the main controller.

poll→<STX>address, MA, channel, low alarm level, high alarm level 1, high alarm level 2, high alarm level 3, alarm dead-band, CS<ETX> response→ACK message

AR—Alarm Report Status

The Analog Alarm Report Status is sent in response to a poll from the power supply controller.

poll→<STX>address, AR, CS<ETX> response→<STX>address, AR, first channel alarm type, first channel alarm value, . . . , last channel alarm type, last channel alarm value, CS<ETX> where the "alarm type" is 1 for low, 2 for high alarm level 1, 3 for high alarm level 2, 4 for high alarm level 3 and "alarm value" is the value that caused the alarm.

MS—Analog Alarm Status

The Metering Alarm Status report is sent in response to a poll from the power supply controller. Metering alarms need not be polled as often as analog alarms.

poll→<STX>address, MS, CS<ETX> response→<STX>address, MS, first channel alarm type, first channel alarm value, . . . , last channel alarm type, last channel alarm value, CS<ETX> where the "alarm type" is 1 for low, 2 for high alarm level 1, 3 for high alarm level 2, 4 for high alarm level 3 and "alarm value" is the value that caused the alarm.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed:

1. An apparatus for monitoring the operation of an electric power conductor, comprising:

a housing having a toroidal shape and means for mounting on said electric power conductor;

a plurality of electrical instruments in said housing for monitoring various parameters associated with the conductor;

recording means in said housing for recording the various parameters being monitored; and analyzing means in said housing for analyzing disturbance and fault events based on the various parameters being monitored, wherein said analyzing means produces fault location reports based on the various parameters monitored from one end of the conductor.

2. The apparatus according to claim 1, wherein the plurality of electrical instruments include:

means for measuring an electric current flowing through the conductor;

means for measuring an electric potential (voltage) of the conductor relative to a ground potential; and means for determining a phase relationship between the measured current and voltage.

3. The apparatus according to claim 1, further comprising means for receiving a global positioning signal (GPS) for use by said analyzing means.

4. The apparatus according to claim 3, wherein the signal from the GPS provides a signal for time-stamping the various parameters being monitored.

5. The apparatus according to claim 1, further comprising power means in said housing for powering the apparatus by induction from an electromagnetic field produced by the energized conductor.

6. The apparatus according to claim 5, wherein said power means includes:

energy storage means for powering said apparatus when the electromagnetic field produced by the energized conductor is below a first threshold level; and charging means for charging the energy storage means by induction when the electromagnetic field exceeds a second threshold level.

7. The apparatus according to claim 1, wherein the plurality of electrical instruments includes:

means for measuring a temperature of the conductor;

means for sensing a pitch angle of the conductor;

means for sensing motion perpendicular to a longitudinal axis of the conductor.

8. The apparatus according to claim 1, further comprising updating means for updating a programming of the analyzing means without removing the apparatus from the power conductor.

9. The apparatus according to claim 1, wherein the housing is enabled to be mounted while the conductor is energized.

10. An apparatus for monitoring the operation of an electric power conductor, comprising:

a housing having a toroidal shape and means for mounting on said electric power conductor;

a plurality of electrical instruments in said housing for monitoring various parameters associated with the conductor;

recording means in said housing for recording the various parameters being monitored; and analyzing means in said housing for analyzing disturbance and fault events based on the various parameters being monitored, means for transmitting and receiving the various parameters being monitored to another apparatus at a different location on the conductor, wherein said analyzing means produces fault location reports based on the various parameters monitored from different locations on the conductor.

*11. An apparatus for monitoring the operation of an electric power conductor, comprising:*

*a housing adapted to be mounted on said electric power conductor;*

*a plurality of electrical instruments in said housing for monitoring various parameters associated with the conductor;*

*recording means in said housing for recording the various parameters being monitored; and*

*analyzing means in said housing for analyzing disturbance and fault events based on the various parameters being monitored, wherein said analyzing means produces fault location reports based on the various parameters monitored from one end of the conductor.*

*12. An apparatus for monitoring the operation of an electric power conductor, comprising:*

*a housing adapted to be mounted on said electric power conductor;*

*a plurality of electrical instruments in said housing for monitoring various parameters associated with the conductor;*

*recording means in said housing for recording the various parameters being monitored; and*

*analyzing means in said housing for analyzing real time processes and disturbance and fault events based on the various parameters being monitored, wherein said analyzing means produces fault and fault location reports based on the various parameters monitored from one end of the conductor.*

* * * * *